(12) United States Patent
Jiang et al.

(10) Patent No.: US 10,989,762 B2
(45) Date of Patent: Apr. 27, 2021

(54) APPARATUS AND METHOD FOR DETECTING BATTERY STATE OF HEALTH

(71) Applicant: HUAWEI TECHNOLOGIES CO., LTD., Guangdong (CN)

(72) Inventors: Jianping Jiang, Shenzhen (CN); Laisuo Su, Beijing (CN); Jianbo Zhang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 275 days.

(21) Appl. No.: 16/121,767

(22) Filed: Sep. 5, 2018

(65) Prior Publication Data

US 2018/0364312 A1 Dec. 20, 2018

Related U.S. Application Data

(63) Continuation of application No. PCT/CN2017/075783, filed on Mar. 6, 2017.

(30) Foreign Application Priority Data

Mar. 9, 2016 (CN) .......................... 201610132573.9

(51) Int. Cl.
*G01R 31/392* (2019.01)
*G01R 31/374* (2019.01)
(Continued)

(52) U.S. Cl.
CPC ........ *G01R 31/392* (2019.01); *G01R 31/3647* (2019.01); *G01R 31/3648* (2013.01); *G01R 31/374* (2019.01); *G01R 31/3835* (2019.01)

(58) Field of Classification Search
CPC ............ G01R 31/3647; G01R 31/3648; G01R 31/374; G01R 31/3835; G01R 31/392
See application file for complete search history.

(56) References Cited

U.S. PATENT DOCUMENTS

2003/0076109 A1   4/2003   Verbrugge et al.
2004/0162683 A1   8/2004   Verbrugge et al.
(Continued)

FOREIGN PATENT DOCUMENTS

CN        102119338 A     7/2011
CN        102998623 A     3/2013
(Continued)

OTHER PUBLICATIONS

Machine Translation and Abstract of Chinese Publication No. CN105334462, dated Feb. 17, 2016, 21 pages.
(Continued)

*Primary Examiner* — Roy Y Yi
*Assistant Examiner* — Geoffrey T Evans
(74) *Attorney, Agent, or Firm* — Conley Rose, P.C.

(57) ABSTRACT

This application provides a method for detecting a battery state of health. In the method, for a battery that does not supply power to a load within a time period, a detected unit is determined; an open-circuit voltage and a temperature of the detected unit are collected; a battery state of charge value and a loss capacity of the detected unit are obtained by means of calculation; and a battery state of health value of the detected unit is obtained by means of calculation according to a ratio of the loss capacity of the detected unit to an original capacity. This application further provides an apparatus for detecting a battery state of health. By means of technical solutions provided in this application, a deterioration degree of battery performance can be accurately monitored, and impact on a service is avoided.

20 Claims, 3 Drawing Sheets

(51) Int. Cl.
*G01R 31/36* (2020.01)
*G01R 31/3835* (2019.01)

(56) References Cited

U.S. PATENT DOCUMENTS

| | | | |
|---|---|---|---|
| 2004/0212367 | A1 | 10/2004 | Dougherty |
| 2009/0037124 | A1 | 2/2009 | Majima |
| 2010/0036626 | A1 | 2/2010 | Kang et al. |
| 2010/0121587 | A1 | 5/2010 | Vian et al. |
| 2011/0140672 | A1* | 6/2011 | Bourbeau .............. H02J 7/0091 320/139 |
| 2011/0148424 | A1 | 6/2011 | Chiang et al. |
| 2012/0035873 | A1* | 2/2012 | Kang ................. G01R 31/3648 702/63 |
| 2013/0030739 | A1* | 1/2013 | Takahashi ............ G01R 31/396 702/63 |
| 2013/0138369 | A1 | 5/2013 | Papana et al. |
| 2014/0343877 | A1 | 11/2014 | Kimura et al. |
| 2015/0120226 | A1 | 4/2015 | Tanabe |
| 2015/0314700 | A1 | 11/2015 | Ahn et al. |
| 2016/0276843 | A1* | 9/2016 | Chang .................... H02J 7/008 |
| 2018/0088181 | A1 | 3/2018 | Jiang et al. |

FOREIGN PATENT DOCUMENTS

| | | |
|---|---|---|
| CN | 103149535 A | 6/2013 |
| CN | 103197257 A | 7/2013 |
| CN | 103823186 A | 5/2014 |
| CN | 104882931 A | 9/2015 |
| CN | 105334462 A | 2/2016 |
| CN | 106324508 A | 1/2017 |
| EP | 2023154 A2 | 2/2009 |
| EP | 3121613 A1 | 1/2017 |
| GB | 2518759 A | 4/2015 |
| JP | H06242193 A | 9/1994 |
| JP | 2000228227 A | 8/2000 |
| JP | 2007057385 A | 3/2007 |
| JP | 2009031219 A | 2/2009 |
| JP | 2011043513 A | 3/2011 |
| JP | 2013076570 A | 4/2013 |
| JP | 2013210340 A | 10/2013 |
| JP | 2015021934 A | 2/2015 |
| JP | 2015111104 A | 6/2015 |
| WO | 2011072295 A2 | 6/2011 |
| WO | 2015141500 A1 | 9/2015 |

OTHER PUBLICATIONS

Zhang. J., et al., "Key technologies and fundamental academic issues for traction battery systems," J. Automotive Safety and Energy, 2012, vol. 3 No. 2, Jun. 2012,18 pages. With English abstract.
Foreign Communication From a Counterpart Application, Chinese Application No. 201610132573.9, Chinese Office Action dated Mar. 11, 2019, 7 pages.
Foreign Communication From a Counterpart Application, Chinese Application No. 201610132573.9, Chinese Search Report dated Feb. 26, 2019, 2 pages.
Machine Translation and Abstract of Chinese Publication No. CN102998623, dated Mar. 27, 2013, 27 pages.
Foreign Communication From a Counterpart Application, Chinese Application No. 201610132573.9, Chinese Office Action dated Aug. 15, 2019, 7 pages.
Foreign Communication From a Counterpart Application, Chinese Application No. 201610132573.9, Chinese Search Report dated Aug. 6, 2019, 2 pages.
Foreign Communication From a Counterpart Application, Korean Application No. 10-2018-7026032, Korean Office Action dated Jun. 25, 2019, 6 pages.
Long Lam et al: "Practical Capacity Fading Model for Li-Ion Battery Cells in Electric Vehicles", IEEE Transactions on Power Electronics, Institute of Electrical and Electronics Engineers, USA, vol. 28, No. 12, Dec. 1, 2013, pp. 5910-5918, XP011514321.
Cheng K W E et al: "Battery-Management System (BMS) and SOC Development for Electrical Vehicles", IEEE Transactions on Vehicular Technology, IEEE Service Center, Piscataway, NJ, US, vol. 60, No. 1, Jan. 1, 2011, pp. 76-88, XP011342167.
Machine Translation and Abstract of Japanese Publication No. JP2000228227, dated Aug. 15, 2000, 8 pages.
Machine Translation and Abstract of Japanese Publication No. JP2007057385, dated Mar. 8, 2007, 22 pages.
Machine Translation and Abstract of Japanese Publication No. JP2013210340, dated Oct. 10, 2013, 29 pages.
Machine Translation and Abstract of Japanese Publication No. JP2015021934, dated Feb. 2, 2015, 30 pages.
Foreign Communication From a Counterpart Application, Japanese Application No. 2018-547419, Japanese Office Action dated Jul. 30, 2019, 3 pages.
Foreign Communication From a Counterpart Application, Japanese Application No. 2018-547419, English Translation of Japanese Office Action dated Jul. 30, 2019, 3 pages.

* cited by examiner

APPARATUS AND METHOD FOR DETECTING BATTERY STATE OF HEALTH

CROSS-REFERENCE TO RELATED APPLICATIONS

This application is a continuation of International Application No. PCT/CN2017/075783, filed on Mar. 6, 2017, which claims priority to Chinese Patent Application No. 201610132573.9, filed on Mar. 9, 2016. The disclosures of the aforementioned applications are hereby incorporated by reference in their entireties.

TECHNICAL FIELD

This application mainly relates to technologies for detecting a battery state of health, and in particular, to an apparatus and a method for estimating a deterioration degree of battery performance for a battery that does not supply power to a load within a time period.

BACKGROUND

As an electric energy storage apparatus, a battery has significant applications in many fields. In an application field of stationary energy storage, a standby power source is usually installed in a communications device such as a data center device, an optical transmission device, or a base station. The standby power source may be a single battery, or may be a battery group including multiple batteries connected in parallel or in series. Usually, if a battery of the standby power source does not supply power to a load within a time period, natural deterioration inevitably occurs in battery performance. Therefore, to ensure that the standby power source can supply a sufficient electricity quantity to the communications device, a user imposes a relatively high requirement on a state of health (SOH) of the battery of the standby power source.

In some existing application fields, although a battery internal resistance is related to a battery capacity, an increase in the battery internal resistance does not necessarily cause a loss of the battery capacity. Comparatively, in most application fields, a battery retention capacity is usually used as a parameter indicator for measuring a battery SOH, and can accurately represent battery capacity information.

For the battery of the standby power source in the communications device, a battery retention capacity parameter cannot be obtained by detecting a load voltage and a load current. Therefore, in the prior art, the battery retention capacity parameter is usually obtained by means of test by using a method in which the battery is fully charged or fully discharged. However, the battery needs to be removed before being fully charged or fully discharged. That is, the battery needs to be removed from the communications device of the battery. If an active power source of the communications device stops supplying power, when the battery of the standby power source is exactly removed and is in a discharging or charging state, the standby power source cannot ensure normal working of the communications device, and this greatly affects a service.

SUMMARY

This application provides an apparatus and a method for detecting a battery state of health, and a base station, so as to detect a battery state of health for a battery that does not supply power to a load within a time period, and accurately monitor a deterioration degree of battery performance.

According to a first aspect, this application provides an apparatus for detecting a battery state of health, and the apparatus includes a CPU module and a sampling circuit. The CPU module is configured to: determine a detected unit, and send control information to the sampling circuit. The detected unit includes at least one battery, and the at least one battery does not supply power to a load within a time period before the at least one battery is detected. The sampling circuit is configured to: receive the control information from the CPU module, collect an open-circuit voltage and a temperature of the detected unit, and output the obtained open-circuit voltage value and temperature value to the CPU module. The CPU module is further configured to: perform calculation according to the open-circuit voltage value received from the sampling circuit, to obtain a battery state of charge value of the detected unit; perform calculation according to the battery state of charge value and the temperature value, to obtain a loss capacity of the detected unit; and perform calculation according to a ratio of the loss capacity of the detected unit to an original capacity, to obtain a battery state of health value of the detected unit.

According to a second aspect, this application provides an apparatus for detecting a battery state of health, and the apparatus includes a CPU module and a sampling circuit. The CPU module is configured to: determine a detected unit, and send control information to the sampling circuit. The detected unit includes at least one battery, and the at least one battery does not supply power to a load within a time period before the at least one battery is detected. The sampling circuit is configured to: receive the control information from the CPU module, collect an open-circuit voltage and a temperature of the detected unit, and output the obtained open-circuit voltage value and temperature value to the CPU module. The CPU module is further configured to: perform calculation according to the open-circuit voltage value received from the sampling circuit, to obtain a battery state of charge value of the detected unit; perform calculation according to the battery state of charge value and the temperature value, to obtain a loss capacity of the detected unit; perform calculation according to a prestored load power value and load end voltage value and the loss capacity of the detected unit, to obtain a retention capacity of the detected unit; and perform calculation according to a ratio of the retention capacity of the detected unit to an original capacity, to obtain a battery state of health value of the detected unit.

With reference to the first aspect or the second aspect, in a possible implementation, the CPU module calculates the battery state of charge value of the detected unit by using the following formula:

$$OCV = a_1(SOC)^n + a_2(SOC)^{n-1} + \ldots + a_n(SOC) + b.$$

In the formula, OCV represents the open-circuit voltage, SOC represents the battery state of charge, n, $a_1$, $a_2$, $a_n$, and b are preset constants, and n is a positive integer.

With reference to the first aspect, the second aspect, or the possible implementation, in a possible implementation, the CPU module calculates the retention capacity of the detected unit by using the following formula:

$$Q_r = \left(I_{th} * \frac{U}{W}\right)^p * (Q_{nom} - Q_{th}).$$

In the formula, $Q_r$ represents the retention capacity of the detected unit, $Q_{nom}$ represents the original capacity of the detected unit, $Q_{th}$ represents the loss capacity of the detected unit, W represents the load power, U represents the load end voltage, $I_{th}$ is a constant, and p is a Peukert coefficient. In this implementation, requirements of a communications device on the load power and the load end voltage are considered, and the retention capacity of the detected unit is further calculated after the loss capacity of the detected unit is obtained, so that the finally obtained battery state of health value is more accurate.

With reference to the first aspect, the second aspect, or the foregoing multiple possible implementations, in a possible implementation, the sampling circuit is configured to: collect temperatures of the detected unit at multiple different detection time points, and output the temperature values obtained at different detection time points to the CPU module. The CPU module is configured to perform calculation according to the battery state of charge value and the temperature values obtained at different detection time points, to obtain the loss capacity of the detected unit. Specifically, the CPU module calculates, by using the following two formulas, first parameters corresponding to the battery state of charge value and the temperature values obtained at different detection time points, and second parameters corresponding to the temperature values obtained at different detection time points:

$$k = x_1 * T + x_2 * T^2 + y_1 * SOC + y_2 * SOC^2 + c * T * SOC + d; \text{ and}$$

$$\alpha = x_0 * \exp(\lambda/T).$$

In the formulas, k represents the first parameter, T represents the temperature of the detected unit, SOC represents the battery state of charge, and $x_1$, $x_2$, $y_1$, $y_2$, c, and d are preset constants; and $\alpha$ represents the second parameter, T represents a temperature of a power source of the detected unit, $\exp(\lambda/T)$ represents an exponential function in which a natural number e is raised to the power of ($\lambda/T$), a value of e is 2.718282, and $x_0$ and $\lambda$ are preset constants. In this implementation, a case in which a temperature of a battery varies with time is considered, and a parameter corresponding to a temperature is calculated according to temperatures collected by the sampling circuit for multiple times, so that the finally obtained battery state of health value is more accurate.

After the CPU module obtains the first parameters and the second parameters, with reference to the foregoing possible implementation, in a possible implementation, the CPU module performs a differential operation according to the first parameters and the second parameters for the temperatures obtained at different detection time points, to obtain a loss capacity that is of the detected unit and is corresponding to a temperature obtained at each detection time point:

$$dQ_{loss} = k * \left[1 + \frac{Q_{loss}(t)}{Q_{nom}}\right]^{-\alpha} dt.$$

In the differential expression, $dQ_{loss}$ represents a loss capacity that is of the detected unit and is obtained based on a difference between a current detection time point and a previous detection time point, k represents the first parameter, $\alpha$ represents the second parameter, $Q_{loss}(t)$ represents a loss capacity that is of the detected unit and is corresponding to a detection time point t, and $Q_{nom}$ represents the original capacity of the detected unit. In this implementation, in consideration that the detected unit does not supply power to the load, and that the detected unit is actually discharged gradually in a form of a small current, a battery loss capacity corresponding to a temperature obtained in each time of sampling is obtained by means of calculation in a differential and recursive manner, so that the finally obtained battery state of health value is more accurate.

With reference to the foregoing multiple possible implementations, in a possible implementation, if the sampling circuit collects a first temperature of the detected unit at a first time point and a second temperature of the detected unit at a second time point, and outputs the first temperature value and the second temperature value to the CPU module, after obtaining the first temperature value, the CPU module calculates, by using the following formula and according to a first parameter and a second parameter that are corresponding to the first temperature, a loss capacity that is of detected unit and is corresponding to the first temperature:

$$Q_{loss} = Q_{nom} * \left\{\left[\frac{(\alpha+1) * k * (t_m - t_0)}{Q_{nom}} + 1\right]^{\frac{1}{\alpha+1}} - 1\right\}.$$

In the formula, $t_0$ represents a battery delivery time point, $t_m$ represents a current detection time point, ($t_m - t_0$) represents days between the current detection time point and the battery delivery time point, $Q_{loss}$ represents a loss capacity that is of the detected unit and is obtained based on a difference between the current detection time point and the battery delivery time point, $Q_{nom}$ represents the original capacity of the detected unit, k represents the first parameter, and $\alpha$ represents the second parameter.

With reference to the foregoing possible implementation, in a possible implementation, after obtaining the first temperature value and the second temperature value, the CPU module calculates, by using the following formula and according to the loss capacity that is of detected unit and is corresponding to the first temperature and a first parameter and a second parameter that are corresponding to the second temperature, a loss capacity that is of detected unit and is corresponding to the second temperature:

$$\Delta Q_{loss} = Q_{loss\_n} * \left\{\left[\frac{(\alpha+1) * k * (t_m - t_n)}{Q_{loss\_n}} + 1\right]^{\frac{1}{\alpha+1}} - 1\right\}.$$

In the formula, $t_n$ represents a previous detection time point, $t_m$ represents a current detection time point, ($t_m - t_n$) represents days between the current detection time point and the previous detection time point, $\Delta Q_{loss}$ represents a loss capacity that is of the detected unit and is obtained based on a difference between the current detection time point and the previous detection time point, $Q_{loss\_n}$ represents a loss capacity that is of the detected unit and is corresponding to a temperature collected at the time point $t_n$, k represents the first parameter, and $\alpha$ represents the second parameter.

With reference to the first aspect, the second aspect, or the foregoing multiple possible implementations, in a possible implementation, the CPU module collects a temperature of the detected unit only at one detection time point, and calculates the loss capacity of the detected unit by using the following formula:

$$Q_{loss} = \exp(S + L/T) * (t_m - t_0) + M.$$

In the formula, $t_0$ represents a battery delivery time point, $t_m$ represents a current detection time point, $(t_m-t_0)$ represents days between the current detection time point and the battery delivery time point, $Q_{loss}$ represents a loss capacity that is of the detected unit and is obtained based on a difference between the current detection time point and the battery delivery time point, $\exp(S+L/T)$ represents an exponential function in which a natural number e is raised to the power of $(S+L/T)$, a value of e is 2.718282, S, L, and M are all constants, and T represents the temperature of the detected unit.

According to a third aspect, this application provides a base station, and the base station includes: a central controller, an active power source, a standby power source, and a load. The central controller controls the active power source or the standby power source to output a voltage and a current that are required by the load. The active power source and the standby power source can provide the voltage and the current for the load. The standby power source includes at least one battery. The base station further includes the apparatus for detecting a battery state of health according to the first aspect, or the second aspect, or the foregoing multiple possible implementations. The detection apparatus detects a state of health of the battery in the standby power source, and determines a detected unit based on the standby power source.

According to a fourth aspect, this application provides a method for detecting a battery state of health. The method is performed by a battery manage unit in a communications device. The communications device may be a base station, and the method for detecting a battery state of health may be performed by a battery manage unit in the base station. The battery manage unit determines a detected unit, where the detected unit includes at least one battery, and the at least one battery does not supply power to a load in the communications device within a time period before the at least one battery is detected. The battery manage unit collects an open-circuit voltage and a temperature of the detected unit; performs calculation according to the open-circuit voltage value obtained by means of collection, to obtain a battery state of charge value of the detected unit; and detects a state of health of the at least one battery in one of the following manners. In one manner, the battery manage unit performs calculation according to the battery state of charge value and the temperature value, to obtain a loss capacity of the detected unit; and performs calculation according to a ratio of the loss capacity of the detected unit to an original capacity, to obtain a battery state of health value of the detected unit. Alternatively, in another manner, the battery manage unit performs calculation according to the battery state of charge value and the temperature value, to obtain a loss capacity of the detected unit; performs calculation according to a prestored load power value and load end voltage value and the loss capacity of the detected unit, to obtain a retention capacity of the detected unit; and performs calculation according to a ratio of the retention capacity of the detected unit to an original capacity, to obtain a battery state of health value of the detected unit.

With reference to the fourth aspect, the battery manage unit may be an apparatus for detecting a battery state of health. With reference to the calculation formulas in the foregoing multiple possible implementations, the battery manage unit performs the following method steps: respectively calculating the battery state of charge value of the detected unit, the loss capacity of the detected unit, and the retention capacity of the detected unit by using different formulas. In different actual cases, method steps for obtaining the loss capacity of the detected unit by the battery manage unit are different. One method step is as follows: The battery manage unit collects temperatures of the detected unit at multiple different detection time points, and performs calculation according to the battery state of charge value and the temperature values obtained at different detection time points, to obtain the loss capacity of the detected unit. Specifically, the battery manage unit respectively calculates, by using different formulas, first parameters corresponding to the battery state of charge value and the temperature values obtained at different detection time points, and second parameters corresponding to the temperature values obtained at different detection time points; and performs a differential operation according to the first parameters and the second parameters, to obtain a loss capacity that is of the detected unit and is corresponding to a temperature obtained at each detection time point. Alternatively, another method step is as follows: The battery manage unit collects a temperature of the detected unit only at one detection time point, and calculates the loss capacity of the detected unit by using a formula.

According to a fifth aspect, this application provides a computer-readable storage medium that includes a program instruction. The program instruction causes a battery manage unit to perform the method steps according to the fourth aspect or the foregoing multiple possible implementations of the fourth aspect.

Based on the foregoing content, in this application, for a battery that does not supply power to a load within a time period, an open-circuit voltage and a temperature of the battery are collected without having the battery removed from a communications device. A battery loss capacity is determined by using the open-circuit voltage value and the temperature value of the battery and a battery state of charge value obtained by means of calculation. In this way, a battery state of health is accurately detected, and impact on a service is avoided.

After the drawings and detailed descriptions in the following are researched, another system, method, feature, and advantage become obvious for a person of ordinary skill in the art. It is required that the another system, method, feature, and advantage are included in the descriptions, fall within the scope of the present application, and are protected by the appended claims.

Figure 1:
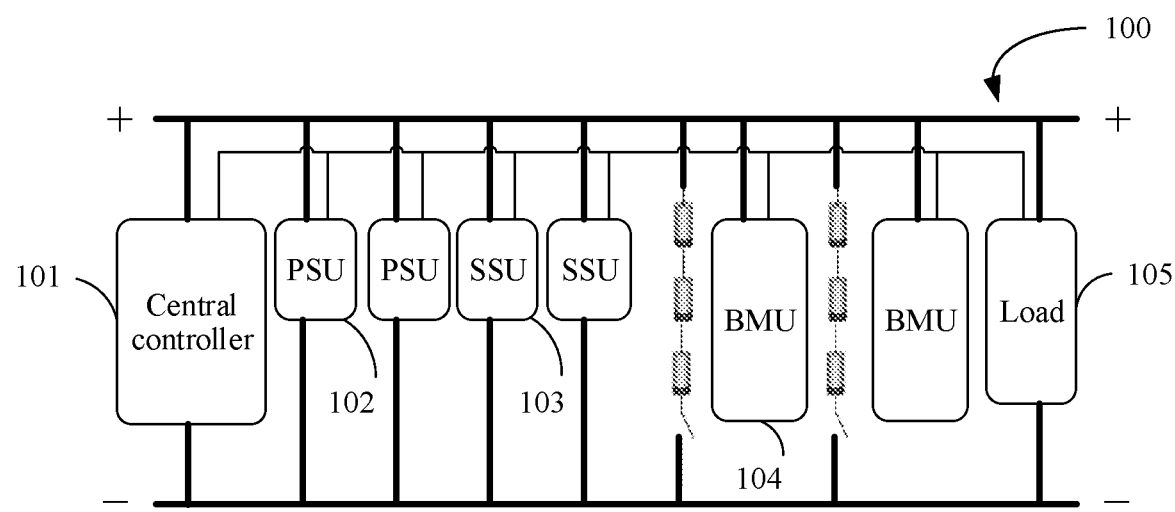
FIG. 1 is a schematic structural diagram of a base station according to an embodiment of the present application.

In all the drawings, a same reference symbol or description represents components that are similar but not necessarily the same. Examples of embodiments described in this specification are easily modified in various manners or replaced in another form. Therefore, specific embodiments are already illustrated by using examples in the accompanying drawings and are described in detail in this specification. However, the examples of the embodiments described in this specification are not intended to limit the disclosed specific form. Instead, the present application covers all modifications, equivalence, and replacements that fall within the scope of the appended claims.

DESCRIPTION OF EMBODIMENTS

The following explains and describes some technical terms throughout this specification, to help understand this application.

A battery SOH represents a battery state of health, and is a ratio of a capacity of a battery that is fully charged after the battery is aged, to an original capacity of the battery at delivery.

A battery retention capacity is a capacity of a battery that is fully charged after the battery is aged.

Battery aging indicates that battery performance deteriorates if a battery does not supply power to a load within a time period.

An open-circuit voltage (OCV) is an end voltage of a battery in an open-circuit state.

A battery SOC (state of charge) represents a battery state of charge, and is a ratio of a remaining capacity of a battery to a capacity of the battery in a fully charged state.

Embodiments in this specification provide various technical solutions, so that a battery state of health can be detected for a battery that does not supply power to a load within a time period.

To make the objectives, technical solutions, and advantages of this application more understandable, the following provides detailed descriptions. The detailed descriptions provide various embodiments of a device and/or a process by using block diagrams, flowcharts, and/or examples. These block diagrams, flowcharts, and/or examples include one or more functions and/or operations. Therefore, a person in the art may understand that each function and/or operation in the block diagrams, the flowcharts, and/or the examples may be performed independently and/or jointly by using much hardware, software, and firmware, and/or any combination thereof.

Generally, a communications device includes a central controller, an active power source, a standby power source, an apparatus for detecting a battery state of health, and a load. The central controller is configured to: control the active power source or the standby power source to output a corresponding voltage and current according to a need of the load, and control the active power source to charge the standby power source. The active power source and the standby power source are configured to provide a reliable voltage and current for the load in the communications device, to ensure that a service is not interrupted. According to a use need of the communications device, the active power source may include one power supply unit (Power Supply Unit, PSU) or multiple PSUs connected in parallel. The PSU is configured to convert an external alternating current into a direct current for use by the load. Alternatively, the active power source may include one solar supply unit (Solar Supply Unit, SSU) or multiple SSUs connected in parallel. The SSU is configured to convert a direct current from a photovoltaic panel into a direct current for use by the load. A voltage of the direct current from the photovoltaic panel is relatively large, and is usually greater than 100 V. A load in a communications device such as a base station usually uses a direct current whose voltage is 48 V. Alternatively, the active power source may include a PSU and an SSU that are connected in parallel.

There may be one or more standby power sources. The standby power source may include one battery or multiple batteries connected in series/parallel. The standby power source usually does not supply power to the load in the communications device. The apparatus for detecting a battery state of health may be referred to as a battery management unit (BMU), or may be referred to as a battery management system (battery manage system, BMS). The apparatus for detecting a battery state of health has different names in different application fields. The BMS and the BMU are only examples, and are not intended to limit this application. The apparatus for detecting a battery state of health is configured to detect a deterioration degree of battery performance in the standby power source. Optionally, a quantity of apparatuses for detecting a battery state of health is related to a quantity of batteries in the standby power source. If there is a relatively large quantity of batteries, a specific quantity of apparatuses for detecting a battery state of health are configured. A type of the battery in the standby power source is not specifically limited, and the type of the battery may include a lithium-ion battery, a lithium polymer battery, a Ni—Cd battery, a NiMH battery, a NiZn battery, and the like.

According to different communications devices, the load is presented in multiple forms. For example, the load may be a high-speed computing processor of a data center device, a baseband radio frequency processing unit of a base station, or a main control board of a fiber optic communications device. The load in this application is not specifically limited.

For example, the communications device is a base station. FIG. 1 is a schematic structural diagram of a base station 100 according to an embodiment of the present application. Referring to FIG. 1, the base station 100 includes a central controller 101, an active power source, a standby power source, two BMUs 104, and a load 105. The central controller 101 is connected to each of the active power source, the standby power source, the BMUs 104, and the load 105 by using a power bus (shown by a thick solid line in FIG. 1). The active power source includes two PSUs 102 and two SSUs 103 that are connected in parallel. The standby power source includes multiple batteries connected in series. The central controller 101 is connected to each of the active power source, the standby power source, the BMUs 104, and the load 105 by using a communications bus (shown by a thin solid line in FIG. 1); controls the PSUs 102 and the SSUs 103 to provide a reliable voltage and current for the load 105; controls the PSUs 102 and the SSUs 103 to charge the standby power source; and controls the load 105 to execute a communication service. When the PSUs 102 and the SSUs 103 stop supplying power, the standby power source provides a reliable voltage and current for the load 105, to ensure that the communication service is not interrupted. In this embodiment, a quantity of PSUs, a quantity of SSUs, and a quantity of batteries are only examples, and are not intended to limit this application.

Figure 2:
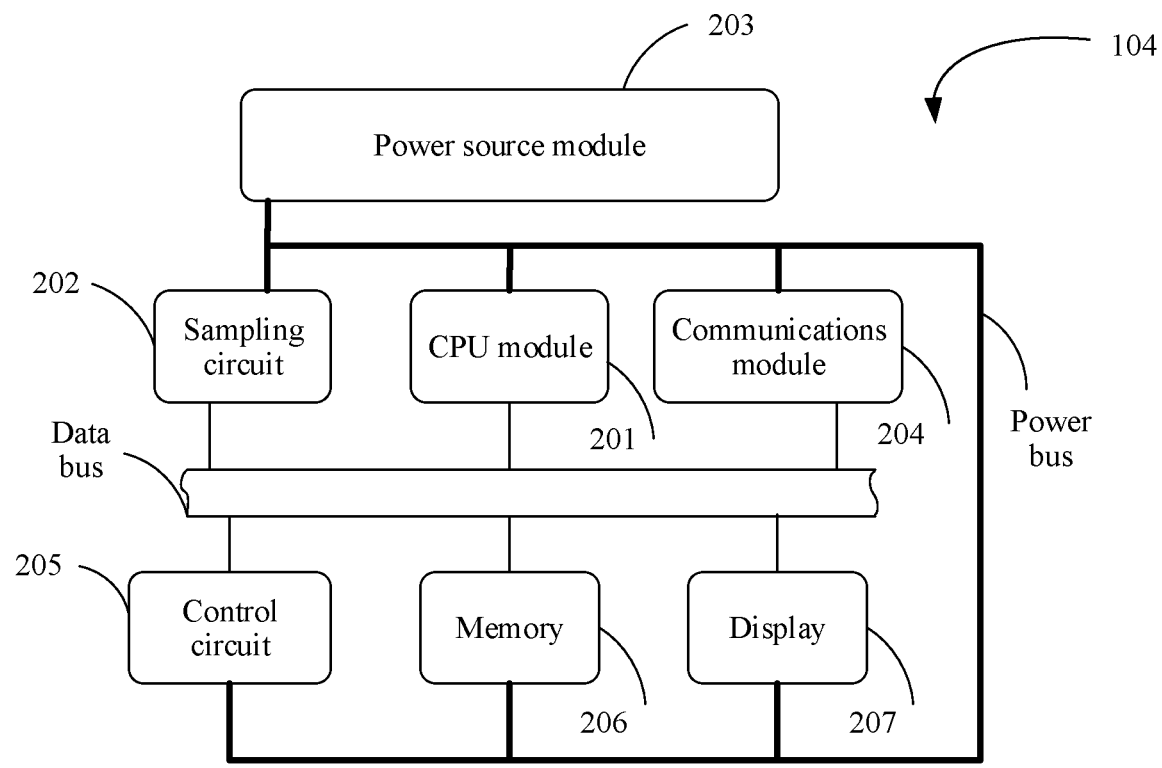
FIG. 2 is a schematic structural diagram of an apparatus for detecting a battery state of health according to an embodiment of the present application.

FIG. 2 is a schematic structural diagram of an apparatus for detecting a battery state of health according to an embodiment of the present application. The apparatus for detecting a battery state of health may be referred to as a BMU. With reference to FIG. 1, FIG. 2 further shows an inner composition structure of the BMU 104. Referring to FIG. 2, the BMU 104 includes a CPU module 201 and a sampling circuit 202. The apparatus may further include a power source module 203, a communications module 204, a control circuit 205, a memory 206, and a display 207.

As shown in FIG. 2, the CPU module 201, the sampling circuit 202, the communications module 204, the control circuit 205, the memory 206, and the display 207 are connected to each other by using a data bus (shown by a thin solid line in FIG. 2). The CPU module 201 is configured to: determine a detected unit, and send control information to the sampling circuit 202. The detected unit includes one or more batteries that do not supply power to the load. For example, if the standby power source is a single battery, the single battery may be used as the detected unit. For example, if the standby power source is a battery group including multiple batteries connected in parallel, the battery group may be used as the detected unit. For example, if the standby power source is a battery group including multiple batteries connected in series, the battery group may be used as the detected unit, or one battery in the battery group may be used as a detected unit, or a battery group including multiple adjacent batteries connected in series in the battery group is used as a detected unit. According to actual composition of the standby power source, with reference to a service requirement, the detected unit may be automatically set by using a preset rule. Alternatively, the detected unit may be set by a person skilled in the art according to experience.

The sampling circuit 202 receives the control information from the CPU module 201, collects an open-circuit voltage of the detected unit, and outputs the collected voltage value to the CPU module 201. Next, the CPU module 201 stores the voltage value in a storage subunit (not shown in the figure) built in the CPU module 201, or the CPU module 201 stores the voltage value in the memory 206. An open-circuit voltage of a battery is an end voltage of the battery in an open-circuit state. The collected open-circuit voltage correspondingly varies with the detected unit. For example, if the detected unit is one battery, voltages at both ends of the battery in the open-circuit state are open-circuit voltages. For example, if the detected unit is a battery group including multiple batteries connected in parallel or in series, voltages at both ends of the battery group in the open-circuit state are open-circuit voltages. The sampling circuit 202 is further configured to: receive the control information from the CPU module 201, collect a temperature of the detected unit, and output the collected temperature value to the CPU module 201. Next, the CPU module 201 stores the temperature value, or the CPU module 201 stores the temperature value in the memory 206. The sampling circuit is further configured to: collect a current electricity quantity state information of the standby power source, and output the electricity quantity state information to the CPU module 201.

The CPU module 201 is further configured to receive information collected by the sampling circuit 202, for example, a battery open-circuit voltage value, a battery current value, a battery level value, or a battery temperature value. The CPU module 201 is further configured to: read various types of information stored in the memory 206, and perform corresponding computing and processing according to a pre-configured algorithm rule.

The power source module 203 is connected to the CPU module 201, the sampling circuit 202, the communications module 204, the control circuit 205, the memory 206, and the display 207 by using a power bus (shown by a thick solid line in FIG. 2). The power source module 203 is configured to complete DC/DC conversion, that is, convert a direct current voltage required by the load into a direct current voltage required by the BMU 104. For example, the BMU 104 is installed in the base station 100. A voltage provided by a power source of the base station 100 for the load 105 is 48 v, and components of the BMU 104 require different voltages. For example, a voltage required by the CPU module 201 is 3.3 v, a voltage required by the sampling circuit 202 is 5 v, a voltage required by the communications module is 3.3 v, a voltage required by the control circuit 205 is 12 v, a voltage required by the memory 206 is 3.3 v, and a voltage required by the display 207 is 3.3 V. In this case, the power source module 203 converts the input voltage of 48 V into the power source voltages required by the components, and outputs the voltages.

The communications module 204 is configured to receive or send information exchanged between the central controller 101 and the BMU 104. When a battery electricity quantity of the standby power source is relatively low, the CPU module 201 sends electricity quantity state information of the standby power source to the communications module 204. The communications module 204 reports the electricity quantity state information to the central controller 101. Next, the central controller 101 sends control information for charging the standby power source to the communications module 204, and the communications module 204 transfers the control information to the CPU module 201. The control circuit 205 is connected to a power switch of the standby power source. The CPU module 201 triggers, according to the control information, the control circuit 205 to switch on the power switch of the standby power source, to close a power line loop between the active power source and the standby power source, so that the battery in the standby power source can obtain an electricity quantity supplement provided by the active power source.

The memory 206 may be a well-known semiconductor component that can record and from which data can be deleted, for example, a RAM, a ROM, an EEPROM, or a mass storage medium such as a hard disk.

The display 207 is configured to output the electricity quantity state information, battery state of health information, and the like of the battery in the standby power source that are obtained by the CPU module 201. The display 207 may use any apparatus that displays the information visually. For example, a display apparatus may be an LCD display or an LED display.

Figure 3:
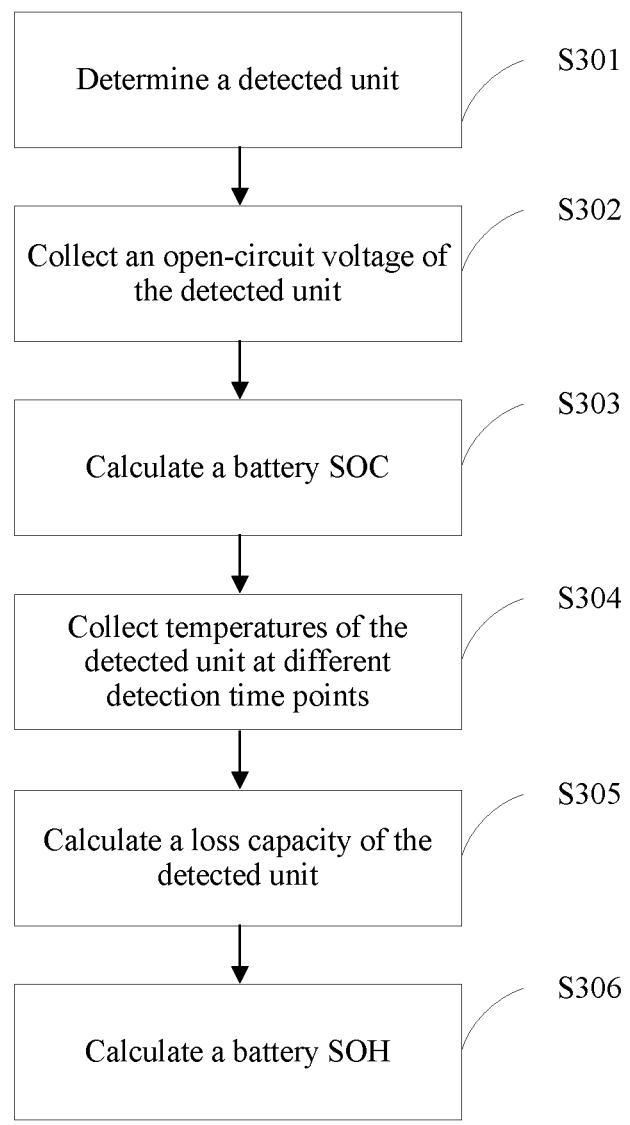
FIG. 3 is a schematic flowchart of a method for detecting a battery state of health according to an embodiment of the present application.

To accurately obtain a battery SOH of the detected unit in the standby power source, multiple factors further need to be considered after state of charge information of the detected unit is obtained. In an embodiment of the present application, because a temperature of a power source of the detected unit varies with time, when calculating the battery SOH value, the apparatus (which may be referred to as a BMU) for detecting a battery state of health needs to consider a relationship between a temperature obtained at a different time point and a battery state of charge, and consider a relationship between a temperature obtained at a different time point and a battery loss capacity. As shown in FIG. 3, FIG. 3 is a schematic flowchart of a method for detecting a battery state of health according to an embodiment of the present application. With reference to the base station 100 described in FIG. 1 and the BMU 104 described in FIG. 2, the following specifically describes how the BMU 104 obtains the battery SOH value by means of calculation.

In S301, the CPU module 201 sends, to the sampling circuit 202, control information for collecting an open-circuit voltage. In S302, the sampling circuit 202 receives the control information from the CPU module 201, collects an open-circuit voltage of the detected unit, and outputs the open-circuit voltage value of the detected unit to the CPU module 201. In S303, the CPU module 201 obtains a battery SOC value by means of calculation according to the open-circuit voltage value of the detected unit.

There are multiple implementations in which the CPU module 201 obtains the battery SOC. For example, the battery SOC value is calculated by using a formula. A correspondence between an open-circuit voltage and a battery SOC may be represented by using the following formula 1:

$$OCV = a_1(SOC)^n + a_2(SOC)^{n-1} + \ldots + a_n(SOC) + b.$$

In formula 1, OCV represents the open-circuit voltage, SOC represents the battery state of charge, and n, $a_1$, $a_2$, $a_n$, and b are constants. Theses constants may be set according to a service requirement, or may be set by a person skilled in the art according to experience, and n is a positive integer. Because the setting manner belongs to the prior art well known by a person skilled in the art, details are not further described herein. A specified constant may be prestored in the storage subunit of the CPU module 201, or may be prestored in the memory 206.

With reference to formula 1, for example, if a value of n is 7, an expression for the correspondence between an open-circuit voltage and a battery state of charge may be as follows:

$$OCV = -89.6*(SOC)^7 + 320*(SOC)^6 - 447.7*(SOC)^5 + 307.7*(SOC)^4 - 105.2*(SOC)^3 + 15.3*(SOC)^2 + 0.3444*(SOC) + 3.31.$$

For another example, before the battery of the standby power source is installed in the communications device, a person skilled in the art obtains information about a correspondence between an open-circuit voltage and a battery SOC by performing multiple times of experiments and tests; and then prestores the information about the correspondence in the memory 206, or prestores the information about the correspondence in the storage subunit of the CPU module 201. Because the experiment and test means belongs to the prior art well known by a person skilled in the art, details are not further described herein. The CPU module 201 receives the open-circuit voltage value of the detected unit, and obtains the battery SOC value by reading the prestored information about the correspondence between an open-circuit voltage and a battery SOC.

In S304, the CPU module 201 sends control information for collecting a temperature to the sampling circuit 202. The sampling circuit 202 receives the control information from the CPU module 201; collects temperatures of the detected unit at different detection time points; and outputs, to the CPU module 201, the temperature values of the detected unit that are obtained at different detection time points. In S305, the CPU module 201 obtains a loss capacity of the detected unit by means of calculation according to the battery SOC value and the temperature values obtained at different detection time points.

Specifically, the sampling circuit 202 collects a temperature of the power source of the detected unit at a first time point (for example, 2015-07-01 9:00), and then outputs a first temperature value of the detected unit to the CPU module 201. For example, if the power source is a single battery, a temperature of the single battery is the collected temperature. For example, if the power source is a battery group including multiple batteries connected in parallel or in series, a temperature of the battery group is the collected temperature.

The CPU module 201 receives the first temperature value of the power source of the detected unit that is obtained at the first time point; and obtains, according to the first temperature value and the battery SOC value, a first parameter and a second parameter that are corresponding to the first temperature value. There are multiple implementations in which the CPU module 201 obtains the first parameter and the second parameter. For example, the first parameter and the second parameter are calculated by using formulas. Specifically: 1) a correspondence between a first parameter and both a temperature of the detected unit and a battery SOC may be represented by using the following formula 2:

$$k = x_1*T + x_2*T^2 + y_1*SOC + y_2*SOC^2 + c*T*SOC + d.$$

In formula 2, k represents the first parameter, T represents the temperature of the power source of the detected unit, SOC represents the battery state of charge, and $x_1$, $x_2$, $y_1$, $y_2$, c, and d are constants. These constants may be set according to a service requirement, or may be set by a person skilled in the art according to experience. Because the setting manner belongs to the prior art well known by a person skilled in the art, details are not further described herein. A specified constant may be prestored in the storage subunit of the CPU module 201, or may be prestored in the memory 206.

With reference to formula 2, for example, an expression for the correspondence between k and both a temperature and a battery state of charge may be as follows:

$$k = -0.0015*T + 0.0000025*T^2 + 0.027*SOC - 0.03*SOC^2 + 0.000045*T*SOC + 0.21.$$

2) A correspondence between a second parameter and a temperature of the detected unit may be represented by using the following formula 3:

$$\alpha = x_0 * \exp(\lambda/T)$$

In formula 3, α represents the second parameter, T represents the temperature of the power source of the detected unit, exp(λ/T) represents an exponential function in which a natural number e is a base, that is, e is raised to the power of (λ/T), a value of e is 2.718282, and $x_0$ and λ are constants. These constants may be set according to a service requirement, or may be set by a person skilled in the art according to experience. Because the setting manner belongs to the prior art well known by a person skilled in the art, details are not further described herein. A specified constant may be prestored in the storage subunit of the CPU module 201, or may be prestored in the memory 206.

With reference to formula 3, for example, an expression for the correspondence between α and T may be as follows:

$$\alpha = 0.000326 * \exp(3583/T)$$

For another example, before the battery of the standby power source is installed in the communications device, a person skilled in the art obtains information about a correspondence between a first parameter and both a temperature of the detected unit and a battery SOC, and information about a correspondence between a second parameter and a temperature of the detected unit by performing multiple times of experiments and tests; and then prestores the two pieces of information about the two correspondences in the memory 206, or in the storage subunit of the CPU module 201. Because the experiment and test means belongs to the prior art well known by a person skilled in the art, details are not further described herein. The CPU module 201 receives the first temperature value; obtains, by reading the prestored information about the correspondence between a first parameter and both a temperature of the detected unit and a battery SOC, the first parameter corresponding to the first temperature value; and obtains, by reading the prestored information about the correspondence between a second parameter and a temperature of the detected unit, the second parameter corresponding to the first temperature value.

The CPU module 201 obtains, according to the first parameter and the second parameter that are corresponding to the first temperature value, a loss capacity that is of the detected unit and is corresponding to the first temperature value. There are multiple implementations in which the CPU module 201 obtains the loss capacity of the detected unit. For example, the loss capacity of the detected unit is calculated by using a formula. Specifically, a correspondence between a loss capacity of the detected unit and both a first parameter and a second parameter may be represented by using the following formula 4:

$$Q_{loss} = Q_{nom} * \left\{ \left[ \frac{(\alpha+1)*k*(t_m - t_0)}{Q_{nom}} + 1 \right]^{\frac{1}{\alpha+1}} - 1 \right\}.$$

In formula 4, $t_0$ represents a battery delivery time point, $t_m$ represents a current detection time point, $(t_m - t_0)$ represents days between the current detection time point and the battery delivery time point, $Q_{loss}$ represents a loss capacity that is of the detected unit and is obtained based on a difference between the current detection time point and the battery delivery time point, $Q_{nom}$ represents an original capacity of the detected unit, k represents the first parameter, and α represents the second parameter. With reference to this embodiment of the present application, for example, the battery delivery time point is 2015-06-01 9:00, and the first time point is used as the current detection time point $t_m$. For example, $t_m$ is 2015-07-01 9:00.

Because the temperature of the power source of the detected unit varies with time, k and α correspondingly change. In this case, the CPU module 201 needs to obtain, by means of calculation in a differential manner and based on the loss capacity that is of the detected unit and is corresponding to the first temperature, a loss capacity that is of the detected unit and is corresponding to a temperature to be collected at a next detection time point. A corresponding differential expression is as follows:

$$dQ_{loss} = k * \left[ 1 + \frac{Q_{loss}(t)}{Q_{nom}} \right]^{-\alpha} dt.$$

In the differential expression, $dQ_{loss}$ represents a loss capacity that is of the detected unit and is obtained based on a difference between a current detection time point and a previous detection time point, k represents the first parameter, and α represents the second parameter. Because differential processing is performed on a basis of time, k and α are separately corresponding to the current time point. $Q_{loss}(t)$ represents a loss capacity that is of the detected unit and is corresponding to a time point t, and $Q_{nom}$ represents the original capacity of the detected unit. In the calculation method, multiple times of temperature sampling are performed, and a loss capacity that is of the detected unit and is corresponding to a temperature obtained in each time of sampling is obtained by means of calculation in a recursive manner and based on each sampling time point. For example, if the sampling circuit 202 collects temperatures $T_1$ and $T_2$ of the power source of the detected unit at two time points, after obtaining a loss capacity that is of the detected unit and is corresponding to $T_1$, the CPU module 201 further needs to obtain, by means of calculation based on a time difference between the two time points, a loss capacity that is of the detected unit and is corresponding to $T_2$. For another example, if the sampling circuit 202 collects temperatures $T_1$, $T_2$, and $T_3$ of the power source of the detected unit at three time points, after obtaining a loss capacity that is of the detected unit and is corresponding to $T_1$, the CPU module 201 first obtains, by means of calculation based on a time difference $(T_2 - T_1)$ between the first two time points, a loss capacity that is of the detected unit and is corresponding to $T_2$; and then obtains, by means of calculation based on a time difference $(T_3 - T_2)$ between the last two time points, a loss capacity that is of the detected unit and is corresponding to $T_3$. A quantity of temperature sampling times is not limited in the foregoing examples. By analogy, other cases are similar. Details are not further described herein.

A further description is given by using an example that the sampling circuit 202 collects temperatures of the power source of the detected unit at two time points. Based on the foregoing description, the sampling circuit 202 obtains a first temperature of the detected unit by means of collection. Next, the sampling circuit 202 collects a second temperature of the detected unit at a second time point, and then outputs the first temperature value and the second temperature value to the CPU module 201. A difference between the second time point and a first time point is usually not greater than 0.5 day. For example, if the second time point is 2015-07-01 15:00, and the first time point is 2015-07-01 9:00, a difference between 2015-07-01 15:00 and 2015-07-01 9:00 is 0.25 day. The CPU module 201 receives the second temperature value, and obtains, according to the second temperature value and the battery SOC value, a first parameter and a second parameter that are corresponding to the second temperature. With reference to the foregoing description, the CPU module 201 may obtain, by using formula 2 and formula 3, the first parameter and the second parameter that are corresponding to the second temperature; or may obtain, by reading prestored correspondence information, the first parameter and the second parameter that are corresponding to the second temperature. A detailed calculation process is not described herein.

The CPU module 201 obtains, by means of calculation by using formula 5 and according to a loss capacity that is of the detected unit and is corresponding to the first temperature and the first parameter and the second parameter that are corresponding to the second temperature, a loss capacity that is of the detected unit and is corresponding to the second temperature Formula 5 is as follows:

$$\Delta Q_{loss} = Q_{loss\_n} * \left\{ \left[ \frac{(\alpha+1)*k*(t_m - t_n)}{Q_{loss\_n}} + 1 \right]^{\frac{1}{\alpha+1}} - 1 \right\}.$$

In formula 5, $t_n$ represents a previous detection time point, $t_m$ represents a current detection time point, $(t_m - t_n)$ represents days between the current detection time point and the previous detection time point, and usually, $(t_m - t_n) \le 0.5$, $\Delta Q_{loss}$ represents a loss capacity that is of the detected unit and is obtained based on a difference between the current detection time point and the previous detection time point, $Q_{loss\_n}$ represents a loss capacity that is of the detected unit and is corresponding to a temperature collected at the time point $t_n$, k represents the first parameter, and α represents the second parameter. With reference to this embodiment of the present application, the first time point is used as $t_n$ (for example, 2015-07-01 9:00), the second time point is used as $t_m$ (for example, 2015-07-01 15:00), days between the second time point and the first time point are used as $(t_m - t_n)$ (for example, the difference between 2015-07-01 15:00 and 2015-07-01 9:00 is 0.25 day), a loss capacity that is of the detected unit and is obtained based on the difference between the second time point and the first time point is used as $\Delta Q_{loss}$, and the loss capacity that is of the detected unit and is corresponding to the first temperature is used as $Q_{loss\_n}$.

The CPU module 201 calculates, by using formula 6 and according to the loss capacity that is of the detected unit and is corresponding to the first temperature and the loss capacity that is of the detected unit and is corresponding to the second temperature, a loss capacity that is of the detected unit and is obtained based on a difference between a current detection time point and a battery delivery time point. Formula 6 is as follows:

$$Q_{th} = Q_{loss} + \Delta Q_{loss}.$$

In formula 6, $Q_{th}$ represents the loss capacity that is of the detected unit and is obtained based on the difference between the current detection time point and the battery delivery time point, $Q_{loss}$ represents a loss capacity that is of the detected unit and is obtained based on a difference between the first detection time point and the battery delivery time point, and $\Delta Q_{loss}$ represents a loss capacity that is of the detected unit and is obtained based on a difference between the current detection time point and a previous detection time point. With reference to this embodiment of the present application, the second time point is used as the current detection time point, the first time point is used as the first detection time point, and the difference between the second time point and the first time point is used as the difference between the current detection time point and the previous detection time point. It should be noted that if the sampling circuit 202 collects temperatures of the power source of the detected unit at at least N (N≥3, and N is a positive integer) time points, the CPU module 201 obtains $Q_{th}$ by means of calculation according to accumulated (N−1) $\Delta Q_{loss}$ in a recursive manner.

In S306, the CPU module 201 obtains a battery SOH value by means of calculation according to a ratio of the loss capacity of the detected unit to the original capacity of the detected unit.

Usually, the original capacity of the detected unit may be a capacity marked on a battery, or may be an original capacity, determined by means of measurement, of a battery at delivery. The CPU module 201 obtains the battery SOH value of the detected unit by means of calculation by using formula 7. Formula 7 is as follows:

$$SOH_{th} = \left[ \frac{Q_{nom} - Q_{th}}{Q_{nom}} \right] * 100\%.$$

In formula 7, $SOH_{th}$ represents the battery state of health of the detected unit, $Q_{nom}$ represents the original capacity of the detected unit, $Q_{th}$ represents the loss capacity that is of the detected unit and is obtained based on the difference between the current detection time point and the battery delivery time point.

In this embodiment of the present application, for a battery that does not supply power to a load within a time period, a battery SOH can be detected without having the battery removed from a communications device application. In a process of obtaining the battery SOH, a means in which the sampling circuit collects temperatures for multiple times is used, and this represents consideration of a factor that a temperature of the battery varies with time. In addition, during calculation, in consideration that the detected unit does not supply power to the load, and that the detected unit is actually discharged gradually in a form of a small current, a battery loss capacity corresponding to a temperature obtained in each time of sampling is obtained by means of calculation in a differential and recursive manner, so that $Q_{th}$ is obtained. A value of $Q_{th}$ is equivalent to a capacity obtained by fully charging or fully discharging the detected unit by using a current $$I_{th} \leq \frac{C}{25},$$

C is a current corresponding to a discharging rate of the detected unit within one hour, and a value of C is equal to a discharging capacity value of the detected unit within one hour. Apparently, in this embodiment of the present application, a deterioration degree of battery performance can be accurately monitored, and impact on a service can be avoided while the battery SOH is detected.

Figure 4:
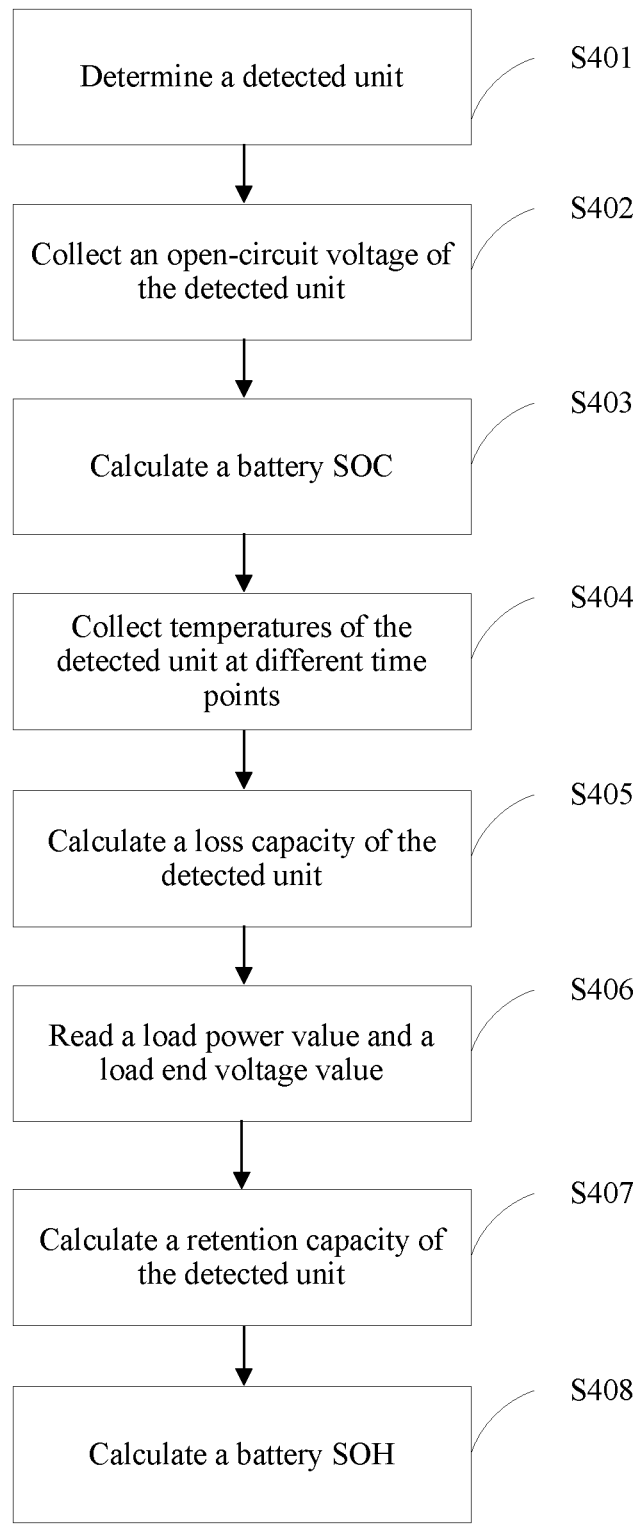
FIG. 4 is a schematic flowchart of a method for detecting a battery state of health according to another embodiment of the present application.

Optionally, in another embodiment of the present application, to accurately obtain a battery SOH of the detected unit in the standby power source, after state of charge information of the detected unit is obtained, it is necessary to consider not only a factor that a temperature of a power source of the detected unit varies with time, but also a current change generated due to the load to which the detected unit supplies power. As shown in FIG. 4, FIG. 4 is a schematic flowchart of a method for detecting a battery state of health according to another embodiment of the present application. In this embodiment, specific content of S401 to S403 is similar to that of S301 to S303 in the foregoing embodiment, and describes how to obtain a battery SOC value by means of calculation. Specific content of S404 and S405 is similar to that of S304 and S305 in the foregoing embodiment, and describes how the CPU module 201 obtains a loss capacity of the detected unit by means of calculation. Therefore, details are not described herein again. A difference between this embodiment and the foregoing embodiment is as follows: In S406, after obtaining the loss capacity of the detected unit by means of calculation, the CPU module 201 reads a prestored load power value and load end voltage value. In S407, the CPU module 201 obtains a retention capacity of the detected unit by means of calculation according to the load power value, the load end voltage value, and the loss capacity of the detected unit.

Specifically, for the base station 100, a power value and an end voltage value that are required by the load 105 are usually prestored in the memory 206 or in the storage subunit of the CPU module 201. The CPU module 201 reads the prestored load power value and load end voltage value, and then calculates the retention capacity of the detected unit by using formula 8. Formula 8 is as follows:

$$Q_r = \left( I_{th} * \frac{U}{W} \right)^p * (Q_{nom} - Q_{th}).$$

In formula 8, $Q_r$ represents a retention capacity of the detected unit at a current detection time point, $Q_{nom}$ represents an original capacity of the detected unit, $Q_{th}$ represents a loss capacity that is of the detected unit and is obtained based on a difference between the current detection time point and a battery delivery time point, W represents the load power, U represents the load end voltage, $I_{th}$ is a constant, and p is a Peukert coefficient. For the constant $I_{th}$, $$I_{th} \leq \frac{C}{25}.$$

A value of C is equal to a discharging capacity value of the detected unit within one hour. Generally, $I_{th}$ may be set according to a service requirement, or may be set by a person skilled in the art according to experience. A specified constant may be prestored in the storage subunit of the CPU module 201, or may be prestored in the memory 206. For p, a person skilled in the art presets information about a correspondence between p and both battery aging degree f and a battery SOC according to experience, and stores the information in the memory 206 or in the storage subunit of the CPU module 201. For example, refer to the following table 1 for a case of a value, and $$f = \frac{Q_{th}}{Q_{nom}}.$$

Based on the description in the foregoing embodiment, the CPU module 201 obtains $Q_{th}$ according to S404 and S405, and can further obtain f by means of calculation. In addition, the CPU module 201 obtains the battery SOC value according to S402 and S403, and the CPU module 201 searches for the prestored information about the correspondence according to f and the battery SOC value, and determines a value of p.

TABLE 1

| | f | | | | | | | |
|---|---|---|---|---|---|---|---|---|
| | 0 ≤ f < 5% | | 5% ≤ f < 10% | | 10% ≤ f < 15% | | 15% ≤ f < 20% | |
| SOC | ≥90% | <90% | ≥90% | <90% | ≥90% | <90% | ≥90% | <90% |
| p | 0.03 | 0.01 | 0.035 | 0.02 | 0.04 | 0.02 | 0.05 | 0.025 |

In S408, the CPU module 201 obtains a battery SOH value by means of calculation according to a ratio of the retention capacity of the detected unit to the original capacity of the detected unit.

The CPU module 201 obtains the battery SOH value of the detected unit by means of calculation by using formula 9. Formula 9 is as follows:

$$SOH_r = \frac{Q_r}{Q_{nom}} * 100\%.$$

In formula 9, $SOH_r$ represents the battery state of health, $Q_{nom}$ represents the original capacity of the detected unit, and $Q_r$ represents the retention capacity of the detected unit at the current detection time point. For $Q_{nom}$ in formula 8 and formula 9, generally, the original capacity of the detected unit may be a capacity marked on a battery, or may be a capacity, determined by means of measurement, of a battery at delivery.

In this embodiment of the present application, for a battery that does not supply power to a load within a time period, a battery SOH can be detected without having the battery removed from a communications device in this embodiment of the present application. In a process of obtaining the battery SOH, not only a means in which the sampling circuit collects temperatures for multiple times is used, but also a method in which a battery loss capacity corresponding to a temperature obtained in each time of sampling is obtained by means of calculation in a differential and recursive manner is used. In addition, impact of the load on a current when the battery supplies power to the load is further considered, and the Peukert coefficient and a requirement of the communications device on the load power and the load end voltage are introduced as calculation factors. Specifically, $$\frac{W}{U} = I_r,$$

and $I_r$ represents a battery discharging current that is corresponding to the load power and that exists when the battery supplies power to the load. According to $$I_{th} \leq \frac{C}{25},$$

$I_r$ is apparently greater than $I_{th}$, and $$I_{th} * \frac{U}{W} = \frac{I_{th}}{I_r},$$

that is, a value obtained by dividing $I_{th}$ by $I_r$ is introduced in a calculation for obtaining the battery SOH value. Apparently, in this embodiment of the present application, a deterioration degree of battery performance can be accurately monitored, impact on a service can be avoided while the battery SOH is detected, and a capability of supplying power to the load by an aged battery is accurately estimated.

Optionally, in another embodiment of the present application, a difference between this embodiment and the foregoing embodiment is as follows: For a special case, that is, a temperature of an environment in which the standby power source is located remains unchanged, the sampling circuit 202 needs to collect a temperature of a power source of the detected unit only once at a current detection time point, and does not need to collect temperatures at different time points. Correspondingly, when calculating a battery SOH value, the CPU module 201 no longer considers, as a factor, a variation relationship between a temperature obtained at a different time point and a battery loss capacity. In this embodiment, specific content of S501 to S503 is similar to that of S301 to S303 in the foregoing embodiment, and describes how to obtain a battery SOC value by means of calculation. Details are not described herein again.

In S504, the CPU module 201 sends control information for collecting a temperature to the sampling circuit 202. The sampling circuit 202 receives the control information from the CPU module 201, collects a temperature of the detected unit at a current detection time point, and outputs one temperature value of the detected unit to the CPU module 201. In S505, the CPU module 201 obtains a loss capacity of the detected unit by means of calculation according to the battery SOC value and the temperature value.

Specifically, for example, the sampling circuit 202 collects a temperature T of the power source of the detected unit at 2015-10-01 9:00, and then outputs the detection time point and the temperature value to the CPU module 201. There are multiple implementations in which the CPU module 201 obtains the loss capacity of the detected unit. For example, the loss capacity of the detected unit is calculated by using formula 10. Formula 10 is as follows:

$$Q_{loss} = \exp(S+L/T)*(t_m-t_0)+M.$$

In formula 10, $t_0$ represents a battery delivery time point, $t_m$ represents a current detection time point, $(t_m-t)$ represents days between the current detection time point and the battery delivery time point, $Q_{loss}$ represents a loss capacity that is of the detected unit and is obtained based on a difference between the current detection time point and the battery delivery time point, $\exp(S+L/T)$ represents an exponential function in which a natural number e is a base, that is, e is raised to the power of $(S+L/T)$, a value of e is 2.718282, S, L, and M are all constants, and T represents the temperature of the power source of the detected unit. For these constants S, L, and M, a person skilled in the art presets information about a correspondence between the constants S, L, and M and a battery SOC, and prestores the information in the memory 206 or in the storage subunit of the CPU module 201. The CPU module 201 obtains the battery SOC value according to S502 and S503, and then searches for the prestored information about the correspondence, so as to determine values of the constants S, L, and M. A method for setting the constants S, L, and M is well known by a person skilled in the art, and details are not further described herein.

Specific content of S506 is similar to that of S306 in the foregoing embodiment, that is, the CPU module 201 calculates a battery SOH value of the detected unit by using formula 7. Details are not described herein again.

Optionally, in another embodiment of the present application, not only a special case is considered, that is, a temperature of an environment in which the standby power source is located remains unchanged, but also a current change generated due to the load to which the detected unit supplies power is considered. In this embodiment, specific content of S601 to S603 is similar to that of S301 to S303 in the foregoing embodiment, and describes how to obtain a battery SOC value by means of calculation. Specific content of S604 and S605 is similar to that of S504 and S505 in the foregoing embodiment, and describes obtaining, by the CPU module 201, a loss capacity of the detected unit by means of calculation by using formula 10 and according only to one temperature value obtained at a current detection time point. Specific content of S606 and S607 is similar to that of S406 and S407 in the foregoing embodiment, and describes obtaining, by the CPU module 201, a retention capacity of the detected unit by means of calculation by using formula 8 and according to a prestored load power value and load end voltage value. Specific content of S608 is similar to that of S408 in the foregoing embodiment, and describes obtaining, by the CPU module 201, a battery SOH value by means of calculation by using formula 9. Partial content in this embodiment is described in detail in the foregoing multiple embodiments, and therefore, details are not described herein again.

In the foregoing embodiment of the present application, for a battery that does not supply power to a load within a time period, a battery SOH can be detected without having the battery removed from a communications device. In a process of obtaining the battery SOH, a special case of the temperature of the environment in which the standby power source is located is considered. In addition, impact of the load on a current when the battery supplies power to the load is further considered, and the Peukert coefficient and a requirement of the communications device on the load power and the load end voltage are introduced as calculation factors. Therefore, in this embodiment of the present application, a deterioration degree of battery performance can be accurately monitored, impact on a service can be avoided while the battery SOH is detected, and a capability of supplying power to the load by an aged battery is accurately estimated.

A person skilled in the art understands that the prior art has progressed to the following degree: Differences between hardware and software implementations of various aspects of a system are extremely small, and use of hardware or software is usually (but not always, because whether hardware or software is selected in some environments becomes very important) an optional design for balancing costs and efficiency. A person skilled in the art understands that there are many tools (such as hardware, software, and/or firmware) capable of implementing the processes and/or systems and/or other technologies in this specification, and that preferred tools change vary with environments in which the processes and/or systems and/or other technologies are deployed.

A person of ordinary skill in the art should understand that all or some of subject matters in this application may be implemented in software in combination with hardware and/or firmware. In an example of an implementation, the subject matters described in this specification may be implemented by using a non-transitory computer readable medium that stores a computer executable instruction. When the CPU module 201 executes the computer executable instruction, the instruction controls the BMU 104 to perform steps. An example of a computer readable medium applicable to implementation of the subject matters described in this specification includes the non-transitory computer readable medium, such as a magnetic disk storage device, a chip storage device, a programmable logical device, or an application-specific integrated circuit. In addition, the computer readable medium that implements the subject matters described in this specification may be located on a single device or computing platform, or may be distributed on multiple devices or computing platforms.

Finally, it should be understood that the foregoing embodiments are only used for explanation, but are not limited to the technical solutions in this application. Although this application is described in detail with reference to the foregoing embodiments, it should be understood that a person skilled in the art may make various modifications, changes, or equivalent replacements without departing from the scope of this application and the appended claims.

What is claimed is:

1. An apparatus for detecting a battery state of health, wherein the apparatus comprises:
   a central processing unit (CPU) module configured to:
      send control information to a sampling circuit;
   a sampling circuit configured to:
      receive the control information from the CPU;
      collect an open-circuit voltage value of a detected unit;
      collect a temperature value of detected unit only at one detection time point; and
      output the open-circuit voltage value and the temperature value to the CPU, wherein the detected unit comprises at least one battery, and wherein the at least one battery does not supply power to a load within a time period before the at least one battery is detected; and
   wherein the CPU is further configured to:
      calculate, according to the open-circuit voltage value, a battery state of charge value of the detected unit;

calculate, according to the battery state of charge value and the temperature value, a loss capacity of the detected unit using the following formula:

$$Q_{loss} = \exp(S+L/T)*(t_m-t_0)+M,$$

wherein $t_0$ represents a battery delivery time point, $t_m$ represents a current detection time point, $(t_m-t_0)$ represents days between the current detection time point and the battery delivery time point, $Q_{loss}$ represents a loss capacity that is of the detected unit and is based on a difference between the current detection time point and the battery delivery time point, $\exp(S+L/T)$ represents an exponential function in which a natural number e is raised to the lower power of $(S+L/T)$, and T represents the temperature value of the detected unit, wherein a value of e is 2.718282, and S, L, and M are all constants; and calculate, according to a ratio of the loss capacity to an original capacity of the detected unit, a battery state of health value of the detected unit.

2. The apparatus of claim 1, wherein the CPU further configured to calculate the battery state of charge value of the detected unit using the following formula:

$$OCV = a_1(SOC)^n + a_2(SOC)^{n-1} + \ldots + a_n(SOC) + b,$$

wherein OCV represents an open-circuit voltage, SOC represents the battery state of charge value, n, $a_1$, $a_2$, $a_n$ and b are preset constants, and n is a positive integer.

3. The apparatus of claim 1, wherein the sampling circuit is configured to:
collect temperature values of the detected unit at multiple different detection time points; and
output the temperature values obtained at different detection time points to the CPU, and
wherein the CPU module is configured to calculate, according to the battery state of charge value and the temperature values obtained at different detection time points, the loss capacity of the detected unit.

4. The apparatus of claim 3, wherein the CPU is configured to calculate first parameters corresponding to the battery state of charge value and the temperature values obtained at different detection time points using the following formula:

$$k = x_1*T + x_2*T^2 + y_1*SOC + y_2*SOC^2 + c*T*SOC + d,$$

wherein k represents a first parameter, T represents the temperature value of the detected unit, SOC represents the battery state of charge value, and $x_1$, $x_2$, $y_1$, $y_2$, c, and d are preset constants.

5. The apparatus of claim 4, wherein the CPU is configured to calculate second parameters corresponding to the temperature values obtained at different detection time points using the following formula:

$$\alpha = x_0*\exp(\lambda/T),$$

wherein $\alpha$ represents a second parameter, T represents a temperature of a power source of the detected unit, and $\exp(\lambda/T)$ represents an exponential function in which a natural number e is raised to the power of $(\lambda/T)$, wherein a value of e is 2.718282, and wherein $x_0$ and $\lambda$ are preset constants.

6. The apparatus of claim 5, wherein the CPU is configured to perform a differential operation according to the first parameters and the second parameters for the temperature values obtained at different detection time points, to obtain a loss capacity that is of the detected unit and is corresponds to a temperature obtained at each detection time point using the following differential expression:

$$dQ_{loss} = k*\left[1 + \frac{Q_{loss}(t)}{Q_{nom}}\right]^{-\alpha} dt,$$

wherein $dQ_{loss}$ represents a loss capacity that is of the detected unit and is obtained based on a difference between the current detection time point and a previous detection time point, k represents the first parameter, a represents the second parameter, $Q_{loss}(t)$ represents a loss capacity that is of the detected unit and corresponds to a detection time point t, $Q_{nom}$ and represents the original capacity of the detected unit.

7. The apparatus of claim 1, wherein the CPU is further configured to calculate the battery state of charge value of the detected unit an open-circuit voltage and preset constants.

8. An apparatus for detecting a battery state of health, the apparatus comprising:
a central processing unit (CPU) configured to send control information to a sampling circuit;
a sampling circuit configured to:
receive the control information from the CPU;
collect an open-circuit voltage value of a detected unit;
collect a temperature value of the detected unit only at one detection time point; and
output the open-circuit voltage value and temperature value to the CPU, wherein the detected unit comprises at least one battery, and wherein the at least one battery does not supply power to a load within a time period before the at least one battery is detected; and
wherein the CPU is further configured to:
calculate, according to the open-circuit voltage value, a battery state of charge value of the detected unit;
calculate, according to the battery state of charge value and the temperature value, a loss capacity of the detected unit using the following formula:

$$Q_{loss} = \exp(S+L/T)*(t_m-t_0)+M,$$

wherein, $t_0$ represents a battery delivery time point, $t_m$ represents a current detection time point, $(t_m-t_0)$ represents days between the current detection time point and the battery delivery time point, $Q_{loss}$ resents a loss capacity that is of the detected unit and is obtained based on a difference between the current detection time point and the battery delivery time point, $\exp(S+L/T)$ represents an exponential function in which a natural number c is raised to the power of $(S+L/T)$, and T represents the temperature value of the detected unit, wherein a value of e is 2.718282, and wherein S, L, and M are all constants, and;
calculate, according to a prestored load power value, a load end voltage value, and the loss capacity of the detected unit, a retention capacity of the detected unit; and
calculate, according to a ratio of the retention capacity of the detected unit to an original capacity of the detected unit, a battery state of health value of the detected unit.

9. The apparatus of claim 8, wherein the CPU module is configured to calculate the battery state of charge value of the detected unit using the following formula:

$$OCV = a_1(SOC)^n + a_2(SOC)^{n-1} + \ldots + a_n(SOC) + b,$$

wherein OCV represents an open-circuit voltage, SOC represents the battery state of charge value, n, $a_1$, $a_2$, $a_n$, and b are preset constants, and n is a positive integer.

10. The apparatus of claim 8, wherein the CPU is configured to calculate the retention capacity of the detected unit using the following formula:

$$Q_r = \left(I_{th} * \frac{U}{W}\right)^p * (Q_{nom} - Q_{th}),$$

wherein $Q_r$ represents the retention capacity of the detected unit, $Q_{nom}$ represents the original capacity of the detected unit, $Q_{th}$ represents the loss capacity of the detected unit, W represents the load power, U represents the load end voltage, $I_{th}$ is a constant, and p is a Peukert coefficient.

11. The apparatus of claim 8, wherein the sampling circuit is configured to:
collect temperature values of the detected unit at multiple different detection time points; and
output the temperature values obtained at different detection time points to the CPU, and
wherein the CPU module is configured to calculate, according to the battery state of charge value and the temperature values obtained at different detection time points, the loss capacity of the detected unit.

12. The apparatus of claim 11, wherein the CPU module is configured to calculate first parameters corresponding to the battery state of charge value and the temperature values obtained at different detection time points using the following formula:

$$k = x_1*T + x_2*T^2 + y_1*SOC + y_2*SOC^2 + c*T*SOC + d,$$

wherein k represents a first parameter, T represents the temperature value of the detected unit, SOC represents the battery state of charge, and $x_1$, $x_2$, $y_1$, $y_2$, c, and d are preset constants.

13. The apparatus of claim 12, wherein the CPU is configured to calculate second parameters corresponding to the temperature values obtained at different detection time points using the following formula:

$$\alpha = x_0 * \exp(\lambda/T),$$

wherein α represents a second parameter, T represents a temperature of a power source of the detected unit, and $\exp(\lambda/T)$ represents an exponential function in which a natural number e is raised to the power of ($\lambda/T$), wherein a value of e is 2.718282, and wherein $x_0$ and λ are preset constants.

14. The apparatus of claim 13, wherein the CPU is configured to perform a differential operation according to the first parameters and the second parameters for the temperature values obtained at different detection time points, to obtain a loss capacity that is of the detected unit and is corresponds to a temperature obtained at each detection time point using the following differential expression:

$$dQ_{loss} = k * \left[1 + \frac{Q_{loss}(t)}{Q_{nom}}\right]^{-\alpha} dt,$$

wherein $Q_{loss}$ represents a loss capacity that is of the detected unit and is obtained based on a difference between the current detection time point and a previous detection time point, k represents the first parameter, a represents the second parameter, $Q_{loss}(t)$ represents a loss capacity that is of the detected unit and corresponds to a detection time point t, and $Q_{nom}$ represents the original capacity of the detected unit.

15. The apparatus of claim 8, wherein the CPU is further configured to calculate the battery state of charge value of the detected unit an open-circuit voltage and preset constants.

16. A method for detecting a battery state of health comprising:
collecting an open-circuit voltage of a detected unit, wherein the detected unit comprises at least one battery;
collecting the temperature value of the detected unit only at one detection time point;
calculating, according to the open-circuit voltage value, a battery state of charge value of the detected unit; and
detecting a state of health of the at least one battery in one of the following two manners:
calculating, according to the battery state of charge value and the temperature value, a loss capacity of the detected unit, and performing calculating, according to a ratio of the loss capacity to an original capacity of the detected unit, to obtain a battery state of health value of the detected unit; or
calculating, according to the battery state of charge value and the temperature value, the loss capacity of the detected unit, calculating, according to a pre-stored load power value, load end voltage value, and the loss capacity of the detected unit, a retention capacity of the detected unit, and calculating, according to a ratio of the retention capacity of the detected unit to the original capacity, the battery state of health value of the detected unit;
wherein the loss capacity of the detected unit is calculated using the following formula:

$$Q_{loss} = \exp(S + L/T) * (t_m - t_0) + M,$$

wherein $t_0$ represents a battery delivery time point, $t_m$ represents a current detection time point, ($t_m - t_0$) represents days between the current detection time point and the battery delivery time point, $Q_{loss}$ represents a loss capacity that is of the detected unit and is obtained based on a difference between the current detection time point and the battery delivery time point, $\exp(S+L/T)$ represents an exponential function in which a natural number e is raised to the power of (S+L/T), and T represents the temperature of the detected unit, wherein a value of e is 2.718282, and wherein S, L, and M are all constants.

17. The method of claim 16, further comprising calculating the battery state of charge value of the detected unit using the following formula:

$$OCV = a_1(SOC)^n + a_2(SOC)^{n-1} + \ldots + a_n(SOC) + b,$$

wherein OCV represents an open-circuit voltage, SOC represents the battery state of charge value, n, $a_1$, $a_2$, $a_n$, and b are preset constants, and n is a positive integer.

18. The method of claim 16, further comprising calculating the retention capacity of the detected unit using the following formula:

$$Q_r = \left(I_{th} * \frac{U}{W}\right)^p * (Q_{nom} - Q_{th}),$$

wherein $Q_r$ represents the retention capacity of the detected unit, $Q_{nom}$ represents the original capacity of the detected unit, $Q_{th}$ represents the loss capacity of the detected unit, W represents the load power, U represents the load end voltage, $I_{th}$ is a constant, and p is a Peukert coefficient.

19. The method of claim 16, further comprising:
collecting temperatures of the detected unit at multiple different detection time points; and
calculating, according to the battery state of charge value and the temperature values obtained at different detection time points, the loss capacity of the detected unit.

20. The method of claim 19, wherein the method comprises calculating first parameters corresponding to the battery state of charge value and the temperature values obtained at different detection time points using the following formula:

$$k = x_1*T + x_2*T^2 + y_1*SOC + y_2*SOC^2 + c*T*SOC + d,$$

wherein k represents the first parameter, T represents the temperature value of the detected unit, SOC represents the battery state of charge value, and $x_1$, $x_2$, $y_1$, $y_2$, c, and d are preset constants.

* * * * *

UNITED STATES PATENT AND TRADEMARK OFFICE
CERTIFICATE OF CORRECTION

PATENT NO. : 10,989,762 B2
APPLICATION NO. : 16/121767
DATED : April 27, 2021
INVENTOR(S) : Jianping Jiang, Laisuo Su and Jianbo Zhang Page 1 of 1

It is certified that error appears in the above-identified patent and that said Letters Patent is hereby corrected as shown below:

On the Title Page

Page 2, item (56) References Cited, Foreign Patent Documents: "CN 103823186 A 5/2014" should read "CN 103823188 A 5/2014"

In the Claims

Claim 1, Column 20, Line 53: "(CPU) module configured to:" should read "(CPU) configured to"

Claim 8, Column 22, Line 51: "natural number c is raised" should read "natural number e is raised"

Claim 9, Column 22, Line 64: "CPU module is" should read "CPU is"

Claim 14, Column 23, Line 64: "wherein $Q_{loss}$ represents" should read "wherein, $dQ_{loss}$ represents"

Claim 16, Column 24, Line 22: "and performing calculating," should read "and calculating,"

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*